(12) United States Patent
Wong

(10) Patent No.: US 6,273,098 B1
(45) Date of Patent: Aug. 14, 2001

(54) EXTENSION OF THE USEFUL LIFE OF A CHEMICAL BATH USED TO PROCESS A SUBSTRATE

(75) Inventor: Kai Chiu Wong, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 08/976,558

(22) Filed: Nov. 24, 1997

(51) Int. Cl.[7] ................................. B08B 7/00; B08B 3/00
(52) U.S. Cl. ............................... 134/1.3; 134/26; 134/28; 134/34; 134/36; 134/902
(58) Field of Search ............................ 134/1.2, 2, 3, 18, 134/26, 28, 29, 1.3, 34, 36, 902

(56) References Cited

U.S. PATENT DOCUMENTS 5,472,516 * 12/1995 Hanson et al. ..................... 134/18

OTHER PUBLICATIONS

Handbook of Semiconductor Wafer Cleaning Technology, editor W. Kern, Noyes Publications, pp. 101, 102, 405, 406, 1993.*

Wong et al., "Post–Acid Rinse Enhancement through Megasonic Quickdump Rinsing," FabTech 6th edition (Section 6—Wafer Processing), ICG Publishing, Ltd., pp. 325–331. Feb. 1997.

* cited by examiner

Primary Examiner—Alexander Markoff
(74) Attorney, Agent, or Firm—David R. Graham

(57) ABSTRACT

The invention enables extension of the useful life of a chemical bath used to process a substrate. The invention can employ an improved rinsing method that removes defects from a substrate with sufficient effectiveness to obtain acceptable defect levels even as the quality (e.g., composition and/or contaminant level) of the chemical bath degrades over time such that substrates that are immersed in the bath accumulate more defects than can be adequately removed by previous rinsing methods. For example, the invention can enable a stagnant chemical bath to be used for a period greater than 24 hours without replacing the bath fluid. Similarly, it is expected that use of the invention can enable a recirculated chemical bath to be used for a period greater than 48 hours without replacing the bath fluid. In particular, the invention can advantageously enable a chemical bath to be used continuously for such extended periods of time, thus reducing the costs associated with stopping use of a chemical bath (to replace the bath fluid or for any other reason). The invention can be used with chemical baths of any of a variety of fluids, including both liquid and gas baths. For example, the invention can be used with a chemical bath that includes (or consists essentially of) sulfuric peroxide, a chemical bath that includes (or consists essentially of) phosphoric acid, or a chemical bath that includes (or consists essentially of) a metal stripping solvent.

30 Claims, 3 Drawing Sheets

EXTENSION OF THE USEFUL LIFE OF A CHEMICAL BATH USED TO PROCESS A SUBSTRATE

BACKGROUND OF THE INVENTION

1. Field of the Invention

This invention relates to use of a chemical bath to process a substrate and, in particular, to extension of the useful life of such a chemical bath. Most particularly, the invention relates to methods for processing a substrate in which the substrate is rinsed after the substrate has been immersed in a chemical bath, and to methods for effecting such rinsing.

2. Related Art

Immersing a substrate in a chemical bath is a common step in the formation of some devices, such as, for example, semiconductor devices. In processing a semiconductor substrate (e.g., semiconductor wafer) to produce a semiconductor device, chemical immersion (and, in particular, wet chemical immersion in which the substrate is immersed in a liquid) is used for a number of different applications. For example, wet chemical immersion is used generally for many wafer cleaning, and bulk etch and strip applications. More particularly, one example of such wet chemical immersion is the use of sulfuric peroxide ("Piranha" cleaning) to remove organic material, such as photoresist, from the surface of a semiconductor wafer. Another example of such wet chemical immersion is the use of phosphoric acid to remove silicon nitride from the surface of a semiconductor wafer. Still another example of such wet chemical immersion is the use of a metal stripping solvent to remove metal from the surface of a semiconductor wafer.

After a substrate has been immersed in a chemical bath, the substrate must typically be cleaned to remove chemical residue from the substrate. Further, since, as indicated above, the chemical immersion is often used to remove material from the substrate or material previously formed on the substrate, it may be necessary to remove particles of the removed material that are redeposited on to the substrate during the chemical immersion. Particles may also be deposited on the substrate as the substrate is transferred from the chemical bath to the apparatus used for the subsequent cleaning process. In general, a cleaning process performed on a substrate subsequent to a chemical immersion of that substrate should desirably minimize the presence of any defects (e.g., contaminants or stains) that may have been introduced to the substrate as a result of the chemical immersion.

FIG. 1 is a flow chart illustrating the above-described two-step process (designated by the numeral 100), i.e., first immersing a substrate in a chemical bath (designated by the numeral 101), then cleaning the substrate to remove defects (designated by the numeral 102).

A typical way to accomplish the above-described cleaning (i.e., step 102 in FIG. 1) has been to "rinse" the substrate with a rinsing fluid. As will be apparent from the description below, "rinsing" can encompass a variety of operations in which a rinsing fluid is passed over the surface of the substrate with the purpose of removing defects present on the substrate. In semiconductor processing, deionized water is often used as the rinsing fluid; however, other fluids can be used.

In one conventional rinsing apparatus, the rinsing apparatus includes a rinsing tank and an overflow tank. Inlet pipes and (generally, any number can be used) are formed through the walls of the tanks and so that rinsing fluid can be flowed into the rinsing tank to immerse a substrate that is held in the tank by a support structure (not shown), such as a wafer boat. Sprayers and (again, generally, any number can be used) are positioned over the rinsing tank so that the sprayers and can spray rinsing fluid into the rinsing tank. A megasonic transducer is positioned near a bottom wall of the rinsing apparatus. The megasonic transducer can be excited (by well-known apparatus to impart megasonic vibrations to the rinsing fluid in the rinsing tank. A fluid-level sensor (the use of which is described further below) is positioned on a side wall of the rinsing tank. One or more doors (or other appropriate opening(s) or passage(s) that can be selectively opened and closed) are formed in a portion of the bottom wall that is part of the rinsing tank to enable rinsing fluid to be drained (preferably rapidly) from the rinsing tank.

In one previous method for rinsing a semiconductor substrate, termed "cascade rinsing," rinsing fluid is flowed into a rinsing tank, gradually filling the rinsing tank and immersing the substrate positioned therein, and eventually overflowing out of the rinsing tank. Thus, a steady flow of rinsing fluid past the substrate is established, the flowing rinsing fluid causing some defects to be removed from the substrate.

In another previous method for rinsing a semiconductor substrate, termed "dump rinsing," rinsing fluid is again flowed into a rinsing tank so that a substrate positioned therein is immersed. At some time after the substrate has been immersed by the rinsing fluid, the rinsing fluid in the rinsing tank is rapidly drained out of the rinsing tank. The rapid flow of rinsing fluid past the substrate effects removal of defects from the substrate and also causes contaminants collected at the bottom of the rinsing tank to be emptied from the rinsing tank.

In still another previous method for rinsing a semiconductor substrate, termed "spray rinsing," sprayers are used to spray rinsing fluid on to a substrate. Spraying rinsing fluid on to a substrate can directly remove defects from the substrate (e.g., dislodge particles on the substrate).

In still other methods for cleaning a semiconductor substrate, a megasonic transducer can be excited to impart megasonic vibrations to fluid that has been accumulated in a tank in which the substrate is at least partially immersed. As is known, the application of megasonic vibrations to a fluid in which a substrate is immersed facilitates the dislodgment of particles from the substrate, thereby enhancing the cleaning of the substrate.

A method for rinsing a semiconductor substrate in which the above-described techniques can be used has been implemented using the rinsing apparatus described above to. Such a method has been used to rinse a semiconductor substrate after immersion in a sulfuric peroxide bath.

In such a method, a rinsing tank is initially filled with rinsing fluid and a substrate is immersed in the rinsing fluid.

The rinsing fluid is dumped from the bottom of the rinsing tank after the substrate has been immersed for a desired length of time.

Rinsing fluid is flowed into the rinsing tank. The flow rate of the rinsing fluid into the rinsing tank is about 3.0 to 3.25 gallons per minute. Sprayers are also used to spray rinsing fluid on to the substrate. The flow rate of the rinsing fluid through the sprayers is about 0.5 to 0.75 gallons per minute. The sprayers continue spraying rinsing fluid on to the substrate until the final dump rinse, (described below) just prior to the end of the method.

A megasonic transducer is excited to produce megasonic vibrations in the rinsing tank when the level of the rinsing fluid in the rinsing tank has reached a first predetermined level. The first predetermined level can be established by the positioning and/or configuration of a fluid-level sensor: the sensor can be, for example, a device that senses when the fluid level in the rinsing tank has risen to the level of the sensor. The first predetermined level is a level at which approximately half of the substrate is immersed in the rinsing fluid.

The application of megasonic energy is stopped when the rinsing fluid has reached a second predetermined level. The second predetermined level can be, for example, when the rinsing tank is full.

Once the rinsing tank is filled, the rinsing fluid is dumped out of the rinsing tank. A brief period (e.g., several seconds or less) of "cascade rinsing" may occur prior to dumping the rinsing fluid from the rinsing tank. Such rinsing fluid overflow may occur incidentally or inadvertently, or because a brief period of overflow of the rinsing fluid is used as an easy way to ascertain when the rinsing tank is full. However, such "cascade rinsing" occurs for as short a period as possible (if at all), since such "cascade rinsing" is not intended as a rinsing mechanism, and because it is desirable to make the overall duration of the method as short as possible.

Typically, the steps of flowing rinsing fluid into the rinsing tank, exciting a megasonic transducer, stopping the application of megasonic energy, and dumping the rinsing fluid out of the rinsing tank are performed multiple times. For example, in one particular implementation of this method, those steps are performed four times. In that implementation, the method takes about 8 minutes to complete.

As discussed above, a substrate that has been processed by being immersed in a chemical bath is typically cleaned by rinsing, using, for example, one of the rinsing methods described above. Over time, the quality of a chemical bath will degrade because, for example, the bath becomes progressively more contaminated with, for example, particles of a material being removed from the substrate by the chemical bath, and because the composition of the chemical bath changes over time. As the quality of the chemical bath degrades, processed substrates will leave the bath with progressively more defects. Thus, it will generally become progressively more difficult for a particular rinsing method to adequately remove defects from the substrates processed in that chemical bath. At some point, the substrates leaving the bath are too contaminated for the rinsing method to clean adequately; at this point, the useful life of the chemical bath is over and the fluid of the chemical bath must be physically replaced or chemically treated before further processing with that chemical bath can continue. (Herein, "replacement" of a chemical bath fluid can refer to physical replacement of the fluid and/or chemical treatment of the fluid.)

The useful life of a chemical bath can be extended by recirculating the bath fluid through a filter system to remove particles from the fluid. (A chemical bath that is not so recirculated, or otherwise cleaned during use to remove particles from the bath, is often referred to as a "stagnant chemical bath," and that terminology is adopted herein. "Recirculated chemical bath" is used herein to refer broadly to any chemical bath which is cleaned during use to remove particles from the bath.) However, the chemical composition of the bath is not affected (or is affected only a small amount), so that, even in a recirculated bath, the bath fluid must eventually be replaced. In general, a recirculated chemical bath can used for somewhat less than twice as long as a stagnant chemical bath. While such extended bath life is clearly desirable, the extended bath life must be weighed against the increased cost—in, for example, equipment and manpower required for operation and maintenance—associated with the presence of the filtering system.

As can be appreciated, there are a number of costs associated with replacing the fluid of a chemical bath that make it desirable to replace the fluid as infrequently as possible so that those costs can be minimized. For example, throughput (the number of substrates processed) decreases as the frequency with which the fluid of a chemical bath must be replaced increases. If the fluid is physically replaced, the vessel containing the old fluid must be emptied and refilled. The vessel is also typically cleaned before being refilled. Additionally, chemical processing often takes places at elevated temperatures (e.g., about 155° C. in a Piranha cleaning process to remove photoresist), necessitating that the old fluid be cooled before being replaced and the new fluid be heated before processing can begin again. Finally, it may be necessary to requalify operation of the chemical bath to ensure that the new fluid processes substrates in accordance with established specifications.

Frequent replacement of the fluid of a chemical bath increases material and labor costs as well. For example, the material cost (e.g., cost of water and chemicals) associated with the fluid used will obviously increase as the frequency with which the fluid of the bath is replaced increases. Frequent replacement of bath fluid can also increase wear and tear on the components of the chemical processing system: for example, the rapidity of deterioration in operation of thermocouples used to monitor the temperature of a heated chemical process increases as the thermocouples are thermally cycled more often, a circumstance attendant increased frequency of replacement of the bath fluid used in the process. Additionally, labor costs will increase with increased frequency of replacement of the fluid of a chemical bath, since, for any given duration of chemical processing, more fluid replacements—and thus more manhours—will generally be required to accomplish chemical processing for that duration of time.

Previously, little attention has been paid to precisely determining the useful life of a chemical bath, much less to determining how different rinsing methods affect the useful life of a chemical bath. One source has indicated that a sulfuric peroxide bath, when used with a rinsing method that is the same as, or similar to, the rinsing method described above, may be useful for up to 24 hours without occurrence of an unacceptable (e.g., greater than about 0.1 defects/$cm^2$) increase in the number of defects present on the processed substrates after rinsing. (For a more detailed discussion, see "Post-Acid Rinse Enhancement through Megasonic Quick-dump Rinsing," by Kai Chiu Wong, Michael B. Olesen and Greg Willits, published in *Semiconductor FabTech*, 6th edition, February 1997, pp. 825–831, the disclosure of which is incorporated by reference herein.) However, typically, the useful life of a chemical bath is arbitrarily established as a time period that provides a comfortable margin of assurance that the chemical bath will remain effective during the entire life of the bath. Such time periods are usually substantially less than 24 hours, e.g., 8 or 12 hours.

In view of the above, it is desirable to more precisely identify the useful life of a chemical bath used to process substrates and to use a particular chemical bath for as long as possible. It is also desirable to increase the useful life of a chemical bath beyond the time period for which such a chemical bath is currently used. More particularly, it is desirable to provide a rinsing method that more effectively removes defects from a substrate that has been immersed in a chemical bath than has heretofore been the case, so that a chemical bath used to process such substrates can be used for as long a time period as possible and, especially, can be used for a longer time period than such chemical bath has previously been used.

SUMMARY OF THE INVENTION

The invention enables extension of the useful life of a chemical bath and, in particular, enables a chemical bath to be used for a longer period of time than has previously been the case. The invention can employ an improved rinsing method that removes defects from a substrate with sufficient effectiveness to obtain acceptable defect levels even as the quality (e.g., composition and/or contaminant level) of the chemical bath degrades over time such that substrates that are immersed in the bath accumulate more defects than can be adequately removed by previous rinsing methods. For example, the use of a chemical bath for time periods as described below is enabled while maintaining a defect level in which less than about 0.1 defects/cm$^2$ are added to a processed substrate from a time before the substrate is immersed in the chemical bath to a time after the substrate is rinsed.

In one embodiment of the invention, a method for processing substrates includes the steps of immersing one or more substrates in a chemical bath, then rinsing the substrates after the substrates have been immersed in the chemical bath. If the chemical bath is a stagnant chemical bath (i.e., a chemical bath that is not recirculated or otherwise cleaned to remove particles during use of the bath), the chemical bath can be used without replacing the bath fluid for a period of greater than 24 hours, more preferably for a period of greater than 30 hours, even more preferably for a period of greater than 36 hours, and most preferably for a period of greater than 48 hours. If the chemical bath is a recirculated chemical bath (i.e., a chemical bath that is recirculated or otherwise cleaned to remove particles during use of the bath), the chemical bath can be used without replacing the bath fluid for a period of greater than 48 hours, more preferably for a period of greater than 60 hours, even more preferably for a period of greater than 72 hours, and most preferably for a period of greater than 84 hours. In particular, according to the invention the chemical bath can be used continuously for these durations of time.

The invention can be used with chemical baths of any of a variety of fluids. For example, the invention can be used with a chemical bath that includes (or consists essentially of) sulfuric peroxide, a chemical bath that includes (or consists essentially of) phosphoric acid, or a chemical bath that includes (or consists essentially of) a metal stripping solvent.

In another embodiment of the invention, a method for rinsing a substrate includes the steps of spraying a rinsing fluid on to the substrate and, after the step of spraying, performing a megasonic cascade rinse of the substrate while the substrate is at least partially immersed in rinsing fluid in a rinsing tank. The megasonic cascade rinse is performed, in one particular embodiment, for greater than about 60 seconds, and, in another particular embodiment, for greater than about 90 seconds. The steps of spraying and megasonic cascade rinsing can be performed a plurality of times, which should, in general, provide improved rinsing. The rinsing method can further include a step of dumping the rinsing fluid from the rinsing tank after the step of megasonic cascade rinsing. Again, the steps of spraying, megasonic cascade rinsing and dumping can be performed a plurality of times, generally resulting in improved rinsing. In a further embodiment of the rinsing method, prior to performing the steps of spraying, megasonic cascade rinsing and dumping a plurality of times, a preliminary megasonic cascade rinse of the substrate can be performed while the substrate is at least partially immersed in rinsing fluid in the rinsing tank. This further embodiment of the rinsing method can also include the step of dumping the rinsing fluid from the rinsing tank after the step of preliminary megasonic cascade rinsing. In one particular embodiment, the preliminary megasonic cascade rinse can be performed for greater than about 15 seconds and the megasonic cascade rinse can be performed for greater than about 60 seconds, while in another particular embodiment, the preliminary megasonic cascade rinse can be performed for greater than about 30 seconds and the megasonic cascade rinse can be performed for greater than about 90 seconds. As can be appreciated from the description herein, a rinsing method according to the invention can be particularly advantageously used to rinse a substrate that has previously been immersed in a chemical bath.

DETAILED DESCRIPTION OF THE INVENTION

Figure 1:
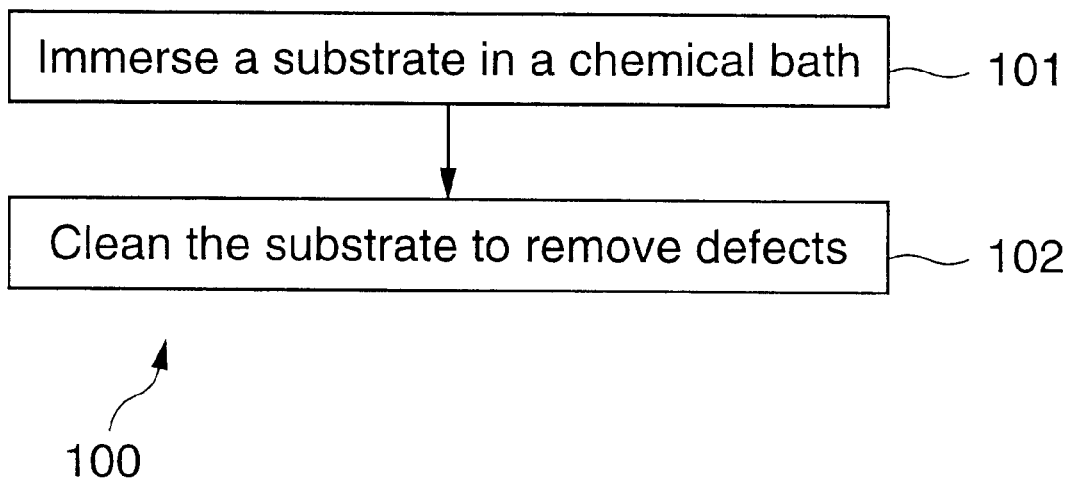
FIG. 1 is a flow chart of a method for processing a substrate in which the substrate is immersed in a chemical bath, then cleaned.

According to the invention, a chemical bath used to process one or more substrates can be used for a longer period of time than that for which the chemical bath has heretofore been used. Such prolonged use of a chemical bath can be enabled by using a rinsing method according to the invention that cleans a substrate after immersion in the chemical bath with greater efficacy than previous rinsing methods used for such cleaning.

As described above, in general, as a chemical bath is used for a longer period of time to process one or more substrates, the bath becomes more contaminated and/or the composition of the bath changes from the desired nominal composition. Thus, the number of defects (e.g., contaminants or stains) on a substrate removed from the chemical bath generally increases as the length of time that the bath has been used increases. A rinsing method used to clean defects from the substrate after immersion in the chemical bath therefore has an increasingly difficult cleaning task. At some point, the rinsing method can no longer adequately clean substrates that have been immersed in the chemical bath, thus necessitating that the chemical bath be replaced (as indicated above, this can encompass physical replacement and/or chemical treatment) to re-establish an acceptable level of contaminants in the bath and/or a desired composition of the bath. Generally, it is desirable that fewer than about 0.1 defects/cm$^2$ are added to the substrate by the combined chemical immersion process and rinsing method.

The increased effectiveness of the rinsing method of the invention can enable adequate cleaning of substrates that have been immersed in a chemical bath to be obtained after a longer period of use of the chemical bath than previously possible. For example, the use of a chemical bath for time periods as described below can be enabled while maintaining a defect level in which almost no defects (see the discussion of FIG. 3 below)—and, in any event, less than about 0.1 defects/cm$^2$—are added to a processed substrate from a time before the substrate is immersed in the chemical bath to a time after the substrate is rinsed.

For example, in a method according to the invention in which one or more substrates are immersed in a chemical bath, then rinsed, a stagnant chemical bath can be used without replacement for a period of greater than 24 hours, more preferably for a period of greater than 30 hours, even more preferably for a period of greater than 36 hours, and most preferably for a period of greater than 48 hours. If the chemical bath is a recirculated chemical bath, the chemical bath can be used without replacement for a period of greater than 48 hours, more preferably for a period of greater than 60 hours, even more preferably for a period of greater than 72 hours, and most preferably for a period of greater than 84 hours. (As indicated above, herein, a "stagnant chemical bath" is a chemical bath that is not recirculated through a filter system or otherwise cleaned during use to remove particles from the bath; a "recirculated bath" is a bath which is cleaned during use to remove particles from the bath.) These times may be extended somewhat depending upon the particular circumstances of the chemical processing (e.g., if relatively few substrates are processed in the chemical bath, then the bath can be used longer).

Generally, the invention can be used with chemical baths of any of a variety of fluids, including both liquids and gases. For example, the invention can be used with a chemical bath of sulfuric peroxide that can be used, for example, to remove photoresist from a substrate by immersing the substrate in the bath. Such a chemical bath has been demonstrated to have a useful life in accordance with the times given above. Or, the invention can be used with a chemical bath of phosphoric acid that can be used, for example, to remove nitride from a substrate by immersing the substrate in the bath. Or, the invention can be used with a chemical bath of a metal stripping solvent (e.g., Posistrip™) that can be used, for example, to remove metal from a substrate by immersing the substrate in the bath. As can be appreciated, the useful life of each particular chemical bath may vary somewhat from the particular magnitudes given herein; however, each type of bath can be used for a longer period of time than has previously been possible, and the magnitudes given herein are representative of the useful bath lives that can be obtained.

Since the invention enables use of a chemical bath for a longer period of time than has previously been the case, the invention enhances the performance of the processing step for which the chemical bath is used. For example, throughput of the processing step is increased, since the total time spent replacing the chemical bath (e.g., time spent emptying and refilling the bath vessel, cleaning the vessel, cooling the old bath fluid before replacement and heating the new bath fluid after replacement, requalifying the new bath fluid) is typically reduced for any period of time for which the processing step is performed. Additionally, costs associated with replacing the chemical bath are reduced (e.g., material costs are reduced as a result of reduced water and chemical consumption, equipment costs are reduced as a result of reduced wear and tear on components of the chemical processing system, labor costs are reduced as a result of the reduced number of manhours required for replacing the bath fluid).

The invention can advantageously be used with a chemical bath that is used either continuously or intermittently. However, when a chemical bath is used intermittently, some of the costs associated with replacing the bath fluid may be reduced or eliminated, since the bath fluid can be replaced when the bath is not being used anyway. This may, for example, reduce or eliminate the need to spend extra time cooling the old bath fluid before replacement or heating the new bath fluid after replacement. This may also reduce or eliminate the increased equipment costs associated with replacing the bath fluid, since such incremental costs may be incurred anyway as a result of the periodic down time (e.g., thermal cycling of thermocouples). Additionally, this may reduce or eliminate the need to spend extra time requalifying the bath after replacing the bath fluid, since such requalification may be necessary anyway after the bath has not been used for a period of time. The increase in manhours associated with replacing the bath fluid may also not be as great, since some of that time would be spent in stopping and starting use of the bath anyway. Thus, as can be appreciated, the invention can be particularly advantageous when the chemical bath is used continuously.

Figure 2:
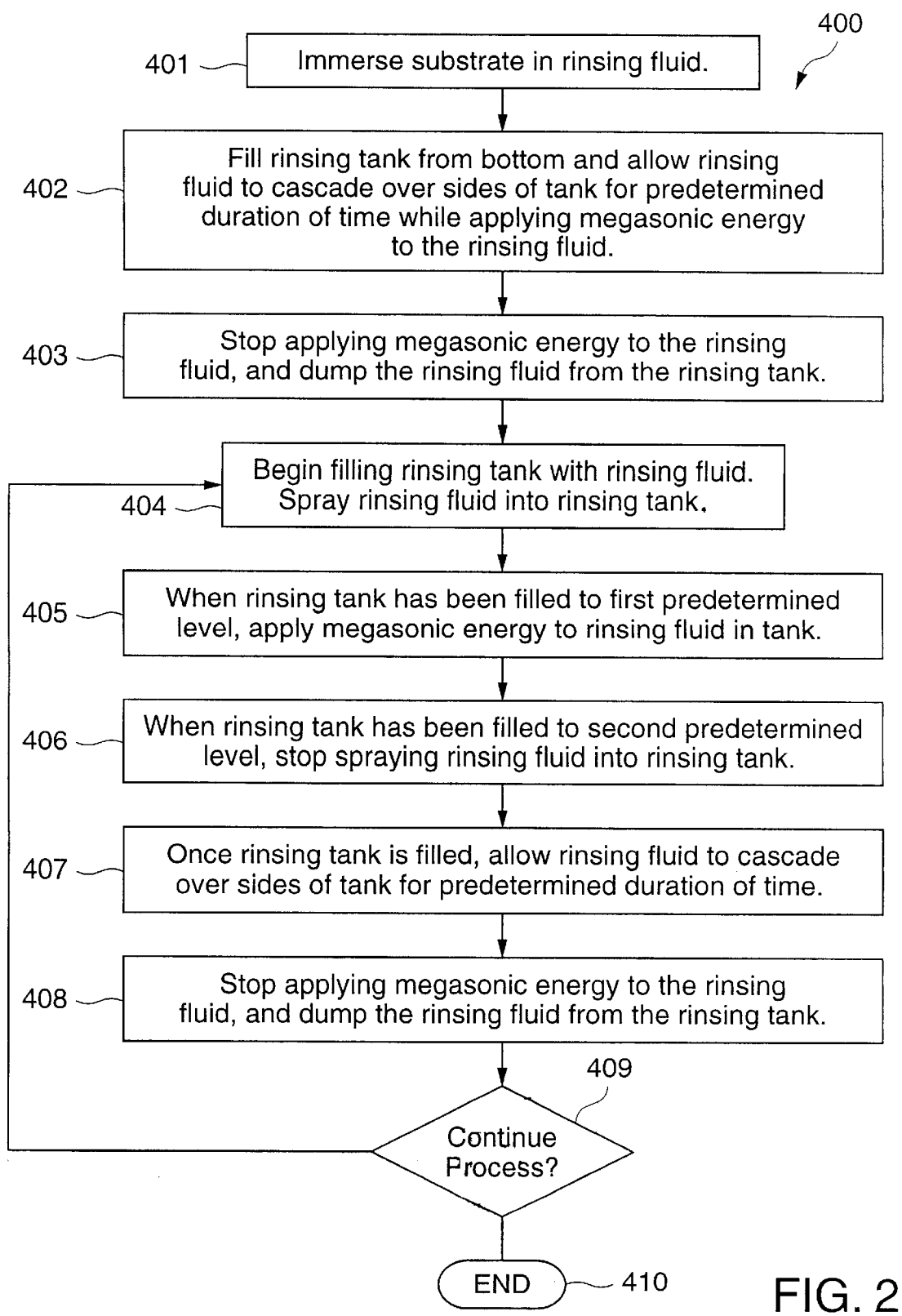
FIG. 2 is a flow chart of a method, according to the invention, for rinsing a substrate.

As stated above, the use of a chemical bath for a prolonged period of time in accordance with the invention can be enabled by using a rinsing method according to the invention. FIG. 2 is a flow chart of a method 400, according to the invention, for rinsing a substrate. The method 400 can advantageously be used to rinse a substrate after the substrate has been processed by immersing the substrate in a chemical bath. The method 400 can be implemented using a rinsing apparatus in accordance with the rinsing apparatus described above in the Related Art section (e.g., a Sunburst Turbo Quickdump™ made by VERTEQ, Inc. of Santa Ana, Calif.), and the method 400 is sometimes described below as implemented with such a rinsing apparatus. However, it is to be understood that such description is made merely to facilitate description of the invention; the method 400 can be implemented with any other appropriate device or devices that are configured to perform the steps of the method 400. Further, though the description below is made with respect to rinsing a single substrate, it is to be understood that the method 400 can be used to rinse multiple substrates at one time.

In the method 400, a rinsing tank is initially filled with rinsing fluid and a substrate is immersed in the rinsing fluid, as shown by the step 401. Any appropriate rinsing fluid can be used, such as water (and, in particular, deionized water).

Next, in the step 402, rinsing fluid is flowed into the rinsing tank (often, near the bottom of the tank) so that the rinsing fluid cascades over the sides of the rinsing tank, i.e., in step 402 a cascade rinse is performed. Generally, the rinsing fluid can be flowed into the tank at any desired flow rate. However, the flow rate during the cascade rinse of step 402 is preferably greater than about 3.0 gallons per minute and more preferably greater than about 3.25 gallons per minute. The flow rate is also preferably less than about 4.0 gallons per minute and more preferably less than about 3.75 gallons per minute. Most preferably, the flow rate is about 3.5 gallons per minute.

Additionally, during the cascade rinse, a megasonic transducer is excited to produce megasonic vibrations in the rinsing fluid. As can be ascertained by those skilled in the art of using megasonic energy to enhance cleaning in a fluid, the megasonic transducer can be controlled to produce vibrations having a frequency, or a frequency within a specified range of frequencies, that is expected to produce particularly effective cleaning in view of the characteristics of the chemical immersion processing step and the equipment used to implement the rinsing method 400. For example, when the above-mentioned Sunburst Turbo Quickdump™ is used to implement the rinsing method 400 after the substrate or substrates to be rinsed have been immersed in a sulfuric peroxide chemical bath to remove photoresist from a surface of the substrate, the megasonic vibrations induced in the rinsing fluid in the rinsing tank can have a frequency between about 800 kHz and 1000 kHz.

The cascade rinse of step 402 is performed for a predetermined duration of time. In particular, it is desirable that the cascade rinse be performed for a predetermined duration of time while the megasonic vibrations are being generated at a desired frequency as described above. (Hereafter, performance of a cascade rinse while megasonic energy is being applied to the rinsing fluid at a desired frequency is sometimes referred to as a "megasonic cascade rinse," while "cascade rinse" is used to refer to performance of a cascade rinse with or without the application of megasonic energy.) The duration of the megasonic cascade rinse is believed to be of particular importance because it is believed that a megasonic cascade rinse is particularly effective in removing defects from a substrate during the method 400. Since the operation of the megasonic apparatus can begin before the rinsing fluid begins cascading over the walls of the rinsing tank and since it can take some time (e.g., 8–12 seconds) for the desired vibration frequency to be established after beginning operation of the megasonic apparatus, the duration of the megasonic cascade rinse may be different than the duration of the entire cascade rinse. In one embodiment of the invention, in the step 402, a megasonic cascade rinse is performed for at least about 15 seconds. In another embodiment of the invention, in the step 402, a megasonic cascade rinse is performed for at least about 30 seconds. In yet another embodiment of the invention, the entire cascade rinse of step 402 is performed for at least about 30 seconds. In still another embodiment of the invention, the entire cascade rinse of step 402 is performed for at least about 45 seconds.

In step 403 of the method 400, the application of megasonic energy to the rinsing fluid is stopped and the rinsing fluid is dumped from the rinsing tank. The dump rinse of step 403 removes "dirty" water from the tank that contains particles and chemical residue removed during the cascade rinse of step 402. The dump rinse can also be effective to remove some defects from the substrate.

In step 404, rinsing fluid is again flowed into the rinsing tank. Sprayers are also used to spray rinsing fluid on to the substrate, acting to remove defects directly from the substrate. (Generally, any number of sprayers can be used.) The rinsing fluid can be sprayed through the sprayers at any desired flow rate. In one embodiment of the invention, the flow rate of preferably greater than about 1.5 gallons per minute, preferably less than about 2.0 gallons per minute, and most preferably about 1.75 gallons per minute.

In step 405, the megasonic transducer is excited to produce megasonic vibrations in the rinsing tank when the level of the rinsing fluid in the rinsing tank has reached a first predetermined level. Typically, the predetermined level is one at which the substrate is at least partly immersed in the megasonic fluid. For example, the first predetermined level can be a level at which approximately half of the substrate is immersed in the rinsing fluid.

In step 406, the spraying of rinsing fluid into the tank is stopped when the rinsing fluid has reached a second predetermined level. Typically, the second predetermined level is one at which the substrate is totally immersed in the megasonic fluid. For example, the second predetermined level can be a level at which the substrate has just become fully immersed in the rinsing fluid.

In step 407, once the rinsing tank has been filled with rinsing fluid, the rinsing fluid is allowed to cascade over the sides of the rinsing tank for a predetermined duration of time. The flow rate of the rinsing fluid into the tank during the cascade rinse of step 407 is preferably as described above with respect to the cascade rinse of step 402. Also like the cascade rinse of step 402, in the cascade rinse of step 407, it is desirable that a megasonic cascade rinse be performed for a predetermined duration of time. As described above, the duration of the megasonic cascade rinse may be different (greater or less) than the duration of the entire cascade rinse. In one embodiment of the invention, in the step 407, a megasonic cascade rinse is performed for at least about 60 seconds. In another embodiment of the invention, in the step 407, a megasonic cascade rinse is performed for at least about 90 seconds. In yet another embodiment of the invention, the entire cascade rinse of step 407 is performed for at least about 1 minute and 15 seconds. In still another embodiment of the invention, the entire cascade rinse of step 407 is performed for at least about 1 minute and 45 seconds.

In step 408, the application of megasonic energy to the rinsing fluid is stopped and the rinsing fluid is dumped from the rinsing tank. As in the step 403, the dump rinse of the step 408 removes "dirty" water from the rinsing tank and may also be effective to remove some defects from the substrate.

Typically, in the method 400, the sequence of steps 404 through 408 is performed multiple times (see step 409) prior to the end 410 of the method 400. All other aspects of the rinsing method 400 remaining the same, cleaning is generally improved as the sequence of steps 404 through 408 is performed additional times (though the incremental increase in cleaning effectiveness typically decreases with each performance of the steps 404 through 408). However, performing the sequence of steps 404 through 408 additional times makes the rinsing method 400 take longer (again, assuming that all other aspects of the rinsing method 400 remain the same), thus reducing throughput. Therefore, the number of times that the sequence of steps 404 through 408 is performed can be chosen in view of the tradeoff between cleaning improvement and reduced throughput. It is also the case, however, that the number of repetitions chosen can be affected by other considerations, such as, for example, the exact duration of particular steps in the method 400 or the characteristics of the equipment used to perform the method 400.

For example, in one particular embodiment of the method 400 in which the method 400 is performed using the above-mentioned Sunburst Turbo Quickdump™, the sequence of steps 404 through 408 is performed eight times. In this embodiment, the cascade rinse of step 402 is performed for about 45 seconds and each cascade rinse of step 407 is performed for about 1 minute and 45 seconds. The entire method 400 takes about 15 minutes to complete.

In another particular embodiment of the method 400 in which the method 400 is performed using the above-mentioned Sunburst Turbo Quickdump™, the sequence of steps 404 through 408 is performed five times. In this embodiment, the cascade rinse of step 402 is performed for about 30 seconds and each cascade rinse of step 407 is performed for about 1 minute and 15 seconds. The entire method 400 takes about 7 minutes and 30 seconds to complete. While this latter particular embodiment of the method 400 typically will not clean substrates as well as the former particular embodiment of the method 400, the latter embodiment does not take as long as the former embodiment, thereby increasing throughput. The latter embodiment may be advantageous, therefore, when the required substrate defect density is relatively less stringent.

Figure 3:
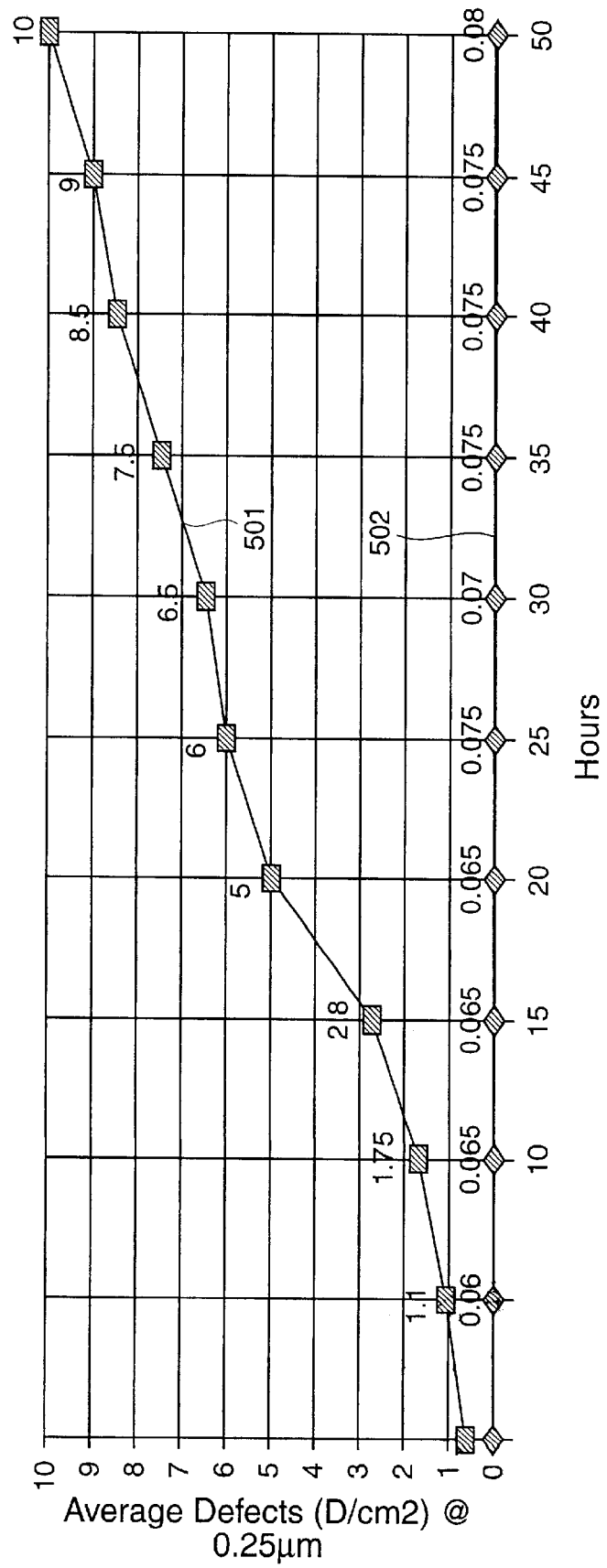
FIG. 3 is a graph of the number of defects per square centimeter on the surface of a processed substrate versus the length of time of use of a chemical bath used to process substrates, illustrating the improved results obtained with a method of the invention as compared to another method.

As described above, the invention enables a chemical bath used to process one or more substrates to be used for a longer period of time than that for which the chemical bath has previously been used. In particular, the invention can enable a chemical bath to be used for a longer period of time while still maintaining acceptable defect levels (i.e., number of defects on the substrate after the substrate has been cleaned subsequent to immersion in the chemical bath). FIG. 3 illustrates this.

Each of two sets of substrates were sequentially immersed in a bath of sulfuric peroxide to remove photoresist from the substrate surfaces. After immersion in the sulfuric peroxide bath, each substrate of the first set of substrates was rinsed using a method in accordance with the previously used rinse method described above in the Related Art section, while each substrate of the second set of substrates was rinsed using a method in accordance with the above-described rinse method 400 according to the invention. Each rinsing method was implemented using the above-mentioned Sunburst Turbo Quickdump™ made by VERTEQ, Inc. The number of defects on a surface of each of the processed substrates was detected using a Tencor 6200 wafer scanning tool. For this comparative test, a defect was any material that should not have been present on the substrate, such as a stain or a contaminant, measuring at least 0.25 micrometers in one dimension.

At the beginning of use of the chemical bath, substrates from each set of substrates had, on average, relatively few defects per square centimeter on the surface of the substrate. However, as shown by the line 501 in FIG. 3, the average number of defects per square centimeter on the surface of a processed substrate increased significantly when the substrates were rinsed using the previously used rinse method described above in the Related Art section. On the other hand, as shown by the line 502 in FIG. 3, the average number of defects per square centimeter on the surface of a processed substrate remained relatively constant when the substrates were rinsed using the rinse method 400 according to the invention, increasing only a negligible amount even after the bath had been used for 50 hours. In particular, after 50 hours of use of the sulfuric peroxide bath, the surfaces of the substrates rinsed with the previously used method had, on average, approximately 10 defects/cm$^2$, while the surfaces of the substrates rinsed with the method according to the invention had, on average, only approximately 0.08 defects/cm$^2$, i.e., 125 times fewer average defects/cm$^2$.

As can be seen, then, the method 400 according to the invention provides greatly improved rinsing of a substrate after immersion in a chemical bath, as compared to the previously used rinsed method described above in the Related Art section. It is believed that this is due, at least in part, to the performance of the cascade rinses (and, in particular, to the megasonic cascade rinses) of steps 402 and 407 (in the rinse method described above in the Related Art section a cascade rinse is either not performed or is performed incidentally for a very short period of time), and to the performance of a periodic spray rinse (see steps 404 and 406) rather than a continual spray rinse (as in the rinse method described above in the Related Art section).

In particular, a spray rinse is not performed during the megasonic cascade rinses of steps 402 and 407. It is believed that the use of a spray rinse during the application of megasonic energy to the rinsing fluid, as in the rinse method described above in the Related Art section, disrupts the vibration frequency near the surface of the rinsing fluid (which is just above the substrate in a typical rinsing tank), thereby degrading the effectiveness of the megasonic cleaning. In contrast, the cascade rinses of the steps 402 and 407 of the method 400 do not disrupt (or disrupt to a significantly lesser degree than a spray rinse) the megasonic vibration frequency and so do not detract from, and may enhance, the megasonic cleaning.

It is also believed that the spray rinse can tend to cause the rinsing fluid flow within the rinsing tank to be directed back toward the substrate, increasing the likelihood that contaminants in the rinsing fluid are deposited on to the substrate rather than carried away from the substrate. In contrast, the cascade rinses of the steps 402 and 407 of the method 400 tend to cause the rinsing fluid flow within the rinsing tank to be directed away from the substrate, thus carrying contaminants away from the substrate.

Various embodiments of the invention have been described. The descriptions are intended to be illustrative, not limitative. Thus, it will be apparent to one skilled in the art that certain modifications may be made to the invention as described above without departing from the scope of the claims set out below. For example, the durations of time given above for cascade rinse and megasonic cascade rinse steps in the method 400 may change somewhat if a megasonic apparatus other than the one that is part of the above-mentioned Sunburst Turbo Quickdump™ is used to produce megasonic vibrations in the rinsing fluid. Those durations of time can also vary if the flow rates into the rinsing tank are increased or decreased relative to the magnitudes given above: in general, the durations of time vary inversely with the change in the flow rate.

I claim:

1. A method for processing substrates, comprising the steps of:

successively immersing one or more sets of one or more substrates in a stagnant chemical bath, wherein substrates are immersed in the chemical bath for a total amount of time greater than about 24 hours without replacing the bath fluid; and rinsing each substrate after the substrate has been immersed in the chemical bath, wherein the step of rinsing comprises the steps of:

filling a rinsing tank with rinsing fluid, the substrate being positioned in the rinsing tank;

spraying rinsing fluid on to the substrate;

when rinsing fluid fills the rinsing tank to a first predetermined level, applying megasonic energy to the rinsing fluid in the rinsing tank;

when rinsing fluid fills the rinsing tank to a second predetermined level, stopping the spraying of rinsing fluid on to the substrate;

after the step of stopping the spraying of rinsing fluid on to the substrate, filling the rinsing tank with rinsing fluid so that the rinsing fluid cascades over the sides of the rinsing tank for a predetermined duration of time during the step of applying megasonic energy;

after passage of the predetermined duration of time, stopping the application of megasonic energy to the rinsing fluid in the rinsing tank; and dumping the rinsing fluid from the rinsing tank.

2. A method as in claim 1, wherein substrates are immersed in the chemical bath for a total amount of time greater than about 30 hours without replacing the bath fluid.

3. A method as in claim 2, wherein substrates are immersed in the chemical bath for a total amount of time greater than about 36 hours without replacing the bath fluid.

4. A method as in claim 3, wherein substrates are immersed in the chemical bath for a total amount of time greater than about 48 hours without replacing the bath fluid.

5. A method as in claim 1, wherein substrates are immersed in the chemical bath for greater than about 24 consecutive hours without replacing the bath fluid.

6. A method as in claim 1, wherein the chemical bath comprises sulfuric peroxide.

7. A method as in claim 1, wherein the chemical bath comprises phosphoric acid.

8. A method as in claim 1, wherein the chemical bath comprises a metal stripping solvent.

9. A method as in claim 1, wherein less than about 0.1 defects/$cm^2$ are added to a processed substrate from a time before the substrate is immersed in the chemical bath to a time after the substrate is rinsed.

10. A method as in claim 1, wherein the predetermined duration of time is greater than about 60 seconds.

11. A method as in claim 1, wherein the steps of filling, spraying, applying, stopping, filling, stopping and dumping are performed a plurality of times.

12. A method as in claim 11, wherein the steps of filling, spraying, applying, stopping, filling, stopping and dumping are performed 5 or more times.

13. A method as in claim 11, wherein the step of rinsing further comprises the steps of, prior to performing the steps of filling, spraying, applying, stopping, filling, stopping and dumping a plurality of times:

preliminary filling the rinsing tank with rinsing fluid;

preliminarily applying megasonic energy to the rinsing fluid in the rinsing tank; and preliminarily filling the rinsing tank with rinsing fluid so that the rinsing fluid cascades over the sides of the rinsing tank for a second predetermined duration of time during the step of preliminarily applying megasonic energy.

14. A method as in claim 13, wherein the step of rinsing further comprises, after passage of the second predetermined duration of time, the steps of:

stopping the preliminary application of megasonic energy to the rinsing fluid in the rinsing tank; and dumping the rinsing fluid from the rinsing tank.

15. A method as in claim 13, wherein:

the second predetermined duration of time is greater than about 15 seconds; and the first predetermined duration of time is greater than about 90 seconds.

16. A method for processing substrates, comprising the steps of:

successively immersing one or more sets of one or more substrates in a recirculated chemical bath, wherein substrates are immersed in the chemical bath for a total amount of time greater than about 48 hours without replacing the both fluid; and rinsing each substrate after the substrate has been immersed in the chemical bath, wherein the step of rinsing comprises the steps of:

filling a rinsing tank with rinsing fluid, the substrate being positioned in the rinsing tank;

spraying rinsing fluid on to the substrate;

when rinsing fluid fills the rinsing tank to a first predetermined level, applying megasonic energy to the rinsing fluid in the rinsing tank;

when rinsing fluid fills the rinsing tank to a second predetermined level, stopping the spraying of rinsing fluid on to the substrate;

after the step of stopping the spraying of rinsing fluid on to the substrate, filling the rinsing tank with rinsing fluid so that the rinsing fluid cascades over the sides of the rinsing tank for a predetermined duration of time during the step of applying megasonic energy;

after passage of the predetermined duration of time, stopping the application of megasonic energy to the rinsing fluid in the rinsing tank; and dumping the rinsing fluid from the rinsing tank.

17. A method as in claim 16, wherein substrates are immersed in the chemical bath for a total amount of time greater than about 60 hours without replacing the bath fluid.

18. A method as in claim 17, wherein substrates are immersed in the chemical bath for a total amount of time greater than about 72 hours without replacing the bath fluid.

19. A method as in claim 18, wherein substrates are immersed in the chemical bath for a total amount of time greater than about 84 hours without replacing the bath fluid.

20. A method as in claim 16, wherein substrates are immersed in the chemical bath for greater than about 48 consecutive hours without replacing the bath fluid.

21. A method as in claim 16, wherein the chemical bath comprises sulfuric peroxide.

22. A method as in claim 16, wherein the chemical bath comprises phosphoric acid.

23. A method as in claim 16, wherein the chemical bath comprises a metal stripping solvent.

24. A method as in claim 16, wherein less than about 0.1 defects/$cm^2$ are added to a processed substrate from a time before the substrate is immersed in the chemical bath to a time after the substrate is rinsed.

25. A method as in claim 16, wherein the predetermined duration of time is greater than about 60 seconds.

26. A method as in claim 1, wherein the steps of filling, spraying, applying, stopping, filling, stopping and dumping are performed a plurality of times.

27. A method as in claim 26, wherein the steps of filling, spraying, applying, stopping, filling, stopping and dumping are performed 5 or more times.

28. A method as in claim 26, wherein the step of rinsing further comprises the steps of, prior to performing the steps of filling, spraying, applying, stopping, filling, stopping and dumping a plurality of times:

preliminarily filling the rinsing tank with rinsing fluid;

preliminarily applying megasonic energy to the rinsing fluid in the rinsing tank; and preliminarily filling the rinsing tank with rinsing fluid so that the rinsing fluid cascades over the sides of the rinsing tank for a second predetermined duration of time during the step of preliminarily applying megasonic energy.

29. A method as in claim 26, wherein the step of rinsing further comprises, after passage of the second predetermined duration of time, the steps of:

stopping the preliminary application of megasonic energy to the rinsing fluid in the rinsing tank; and dumping the rinsing fluid from the rinsing tank.

30. A method as in claim 26, wherein:

the second predetermined duration of time is greater than about 15 seconds; and the first predetermined duration of time is greater than about 90 seconds.

* * * * *